United States Patent
Zhang et al.

(10) Patent No.: US 10,082,721 B2
(45) Date of Patent: Sep. 25, 2018

(54) NONLINEAR OPTICAL CRYSTAL MATERIAL, METHOD FOR PREPARATION THEREOF, AND APPLICATION THEREOF

(71) Applicant: FUJIAN INSTITUTE OF RESEARCH ON THE STRUCTURE OF MATTER, CHINESE ACADEMY OF SCIENCES, Fujian (CN)

(72) Inventors: Mingjian Zhang, Fujian (CN); Guocong Guo, Fujian (CN); Huiyi Zeng, Fujian (CN); Binwen Liu, Fujian (CN); Yong Liu, Fujian (CN); Bingxuan Li, Fujian (CN)

(73) Assignee: Fujian Institute of Research on the Structure of Matter, Chinese Academy of Sciences, Fujian (CN)

( * ) Notice: Subject to any disclaimer, the term of this patent is extended or adjusted under 35 U.S.C. 154(b) by 0 days.

(21) Appl. No.: 15/613,661

(22) Filed: Jun. 5, 2017

(65) Prior Publication Data
US 2017/0269456 A1    Sep. 21, 2017

Related U.S. Application Data

(63) Continuation-in-part of application No. PCT/CN2014/093182, filed on Dec. 5, 2014.

(51) Int. Cl.
*G02F 1/355* (2006.01)
*G02F 1/37* (2006.01)
(Continued)

(52) U.S. Cl.
CPC .............. *G02F 1/3551* (2013.01); *C30B 1/02* (2013.01); *C30B 1/10* (2013.01); *C30B 29/46* (2013.01);
(Continued)

(58) Field of Classification Search
CPC ......... G02F 1/3551; C30B 1/10; C30B 29/46; G01V 8/10; H01S 3/10
See application file for complete search history.

(56) References Cited

U.S. PATENT DOCUMENTS 6,508,960 B1 *   1/2003   Ohmer ................... C30B 29/46
                                                              252/582
9,513,532 B2 *  12/2016   Zhang ................... C01G 15/00
(Continued)

FOREIGN PATENT DOCUMENTS

CN         102312279 A     1/2012
CN         102681289 A     9/2012
(Continued)

*Primary Examiner* — Daniel Petkovsek
(74) *Attorney, Agent, or Firm* — Nath, Goldberg & Meyer; Joshua B. Goldberg; Tanya E. Harkins (57) ABSTRACT

The present application discloses a nonlinear optical crystal material, preparation method and application of the nonlinear optical crystal material. A nonlinear optical crystal material, whose molecular formula is $Ga_2Se_3$; wherein the crystal structure of said nonlinear optical crystal material belongs to trigonal system, space group R3 with the lattice parameters of a=b=3~4.2 Å, c=9~10 Å, $\alpha=\beta=90°$, $\gamma=120°$ and Z=1. The nonlinear optical crystal material has an excellent infrared nonlinear optical performance, whose frequency-doubling intensity can reach 9.3 times of $AgGaS_2$ with the same particle size, and it meets type-I phase matching; and its laser damage threshold can reach 7.5 times of $AgGaS_2$ with the same particle size. The nonlinear optical crystal material has important application value in the frequency-converters which can be used for frequency doubling, sum frequency, difference frequency, optical parametric oscillation of laser in mid and far infrared waveband, and the like.

21 Claims, 4 Drawing Sheets

(51) Int. Cl.
*G02F 1/39* (2006.01)
*G02F 1/35* (2006.01)
*H01S 3/06* (2006.01)
*G01J 1/04* (2006.01)
*C30B 1/10* (2006.01)
*C30B 29/46* (2006.01)
*C30B 1/02* (2006.01)

(52) U.S. Cl.
CPC ............... *G01J 1/04* (2013.01); *G02F 1/3544* (2013.01); *G02F 1/37* (2013.01); *G02F 1/39* (2013.01); *H01S 3/0602* (2013.01)

(56) References Cited

U.S. PATENT DOCUMENTS

| | | | |
|---|---|---|---|
| 2009/0041067 A1* | 2/2009 | Meissner | G02F 1/3501 372/22 |
| 2015/0146281 A1 | 5/2015 | Zhang et al. | |
| 2016/0377957 A1 | 12/2016 | Zhang et al. | |
| 2017/0268126 A1* | 9/2017 | Zhang | C30B 29/46 |

FOREIGN PATENT DOCUMENTS

| | | | | |
|---|---|---|---|---|
| CN | 103058266 A | 4/2013 | | |
| CN | 103484938 A | 1/2014 | | |
| CN | 103572372 A | 2/2014 | | |
| CN | 103866391 A | 6/2014 | | |
| EP | 0786542 A1 | 7/1997 | | |
| WO | WO 2016086425 A1 * | 6/2016 | .............. | C30B 1/10 |
| WO | WO 2016086426 A1 * | 6/2016 | .............. | C30B 1/10 |

* cited by examiner

NONLINEAR OPTICAL CRYSTAL MATERIAL, METHOD FOR PREPARATION THEREOF, AND APPLICATION THEREOF

This is a bypass continuation-in-part of PCT/CN2014/093182, filed Dec. 5, 2014, the content of each of which is hereby incorporated by reference in its entirety.

TECHNICAL FIELD

The present application relates to nonlinear optical crystal material, method for preparation thereof, and application thereof on an infrared detector, an infrared laser, an optical parametric oscillator and a second harmonic generator, belonging to the technical field of nonlinear optical crystal material.

BACKGROUND

Infrared nonlinear optical crystal materials have a promising future in the field of civil use, scientific research and military, such as molecular spectrum, non-invasive medical diagnostic test, environmental monitoring, deep space exploration, space telescope, infrared laser radar, laser communication, opto-electronic countermeasure, and the like. At present, mid-/far-infrared laser with wavelength of 2~20 μm is obtained based on the principles of nonlinear optics and infrared nonlinear optical frequency conversion technology. Commercial mid-/far-infrared nonlinear optical crystals mainly contain $AgGaS_2$, $AgGaSe_2$, $ZnGeP_2$, and the like. These crystals have been widely used in production, live, scientific research and military equipment, while these crystals have respective shortcomings, such as low laser damage threshold, difficult growth of large crystal, and their comprehensive performance could not meet increasing application demands.

With development of technology and increasing demands, it is of great significance and urgent to develop more infrared nonlinear optical crystals with more outstanding comprehensive performance. Therefore, the development and growth of new infrared nonlinear optical crystals is not only a challenge for the synthesis and growth of crystal materials, but has important strategic significance in development of civilian high-tech industry and strengthening of national defense capability.

DISCLOSURE

According to an aspect of the present application, a nonlinear optical crystal material is disclosed. The nonlinear optical crystal material has an excellent infrared nonlinear optical performance, whose frequency-doubling intensity can reach 9.3 times of $AgGaS_2$ (abbreviated as AGS) with the same particle size, and it meets type-I phase matching. And the laser damage threshold of the nonlinear optical crystal material can reach 7.5 times of $AgGaS_2$ with the same particle size. The nonlinear optical crystal material has important application value in the frequency-converters which can be used for frequency doubling, sum frequency, difference frequency, optical parametric oscillation of laser in mid-/far-infrared waveband, and the like.

Said nonlinear optical crystal material, whose molecular formula is wherein the crystal structure of said nonlinear optical crystal material belongs to a trigonal system, and space group R3 with the lattice parameters of a=b=3~4.2 Å, c=9~10 Å, α=β=90°, γ=120° and Z=1. The valences of gallium and selenium are +3 and −2, respectively. A gallium atom connects with four selenium atoms to form a GaSe4 tetrahedron, and GaSe4 tetrahedral share corners to form three-dimensional network structure.

As a preferred embodiment, in the lattice parameters, a=b=3.8~3.9 Å, c=9.4~9.5 Å.

As a more preferred embodiment, in the lattice parameters, a=b=3.86 Å, c=9.44 Å.

According to another aspect of the present application, a method for preparing said nonlinear optical crystal material is disclosed, wherein after homogeneously mixing raw materials containing gallium, boron and selenium with a fluxing agent, said nonlinear optical crystal material is obtained using high temperature solid state method under a vacuum condition.

As a preferred embodiment, in said raw materials, the molar ratio of element gallium, element boron and element selenium is Ga:B:Se=2:2:3.

As an embodiment, said high temperature solid state method is that the mixture of the raw materials and the fluxing agent is kept in the temperature range from 700° C. to 1000° C. for no less than 24 hours.

As a preferred embodiment, said high temperature solid state method is that the mixture of the raw materials and the fluxing agent is kept in the temperature range from 800° C. to 1000° C. for no less than 24 hours. As a more preferred embodiment, said high temperature solid phase method is that the mixture of the raw materials and the fluxing agent is kept in the temperature range from 850° C. to 950° C. for a time range from 1 day to 3 days.

As a preferred embodiment, said high temperature solid state method is that the mixture of the raw materials and the fluxing agent is kept in the temperature range from 500° C. to 700° C. for no less than 1 hour, and then kept in the temperature range from 800° C. to 950° C. for no less than 24 hours.

As a preferred embodiment, said raw materials contain gallium oxide, elementary substance of boron and elementary substance of selenium.

As a preferred embodiment, said fluxing agent is at least one selected from alkali metal halides, and alkali earth metal halides. As a more preferred embodiment, said fluxing agent is at least one selected from NaCl, KCl, RbCl, CsCl, NaBr, KBr, RbBr, CsBr, NaI, KI, RbI, CsI, $MgCl_2$, $BaCl_2$, $MgBr_2$, $BaBr_2$, $MgI_2$ and $BaI_2$. As a further preferred embodiment, said fluxing agent is KBr and/or KI.

A skilled person in this art can select the usage amount of said fluxing agent according to actual demand. As a preferred embodiment, the mass ratio of said fluxing agent to said raw material is that fluxing agent:said raw material=1~10:1. As a more preferred embodiment, the mass ratio of said fluxing agent to said raw material is that fluxing agent:said raw material=2~5:1. As a further preferred embodiment, the mass ratio of said fluxing agent to said raw material is that fluxing agent:said raw material=3~5:1.

According to another aspect of the present application, an infrared detector is disclosed, which contains any said nonlinear optical crystal material and/or the nonlinear optical crystal material prepared by any said method.

According to another aspect of the present application, an infrared laser is disclosed, which contains any said nonlinear optical crystal material and/or the nonlinear optical crystal material prepared by any said method.

Optical parametric oscillators and second harmonic generators are commonly used nonlinear optical devices, and the second order nonlinear optical material is the key material for achieving the function thereof. For a second order nonlinear optical material in the infrared region, this disclosure uses a trigonal phase $Ga_2Se_3$ crystal which has never been used in the art, obtaining an optical parametric oscillator and a second harmonic generator.

According to another aspect of the present application, an optical parametric oscillator is disclosed, which contains, in the light path, a pump laser source, a first lens, a nonlinear optical crystal, and a second lens, in this order;
wherein an optical parametric oscillation chamber is formed between the first lens and the second lens;
wherein the nonlinear optical crystal is at least one selected from any said nonlinear optical crystal material and/or the nonlinear optical crystal material prepared by any said method.

As an embodiment, the wavelength of the laser emitted by the pump laser source is in a range from 1 to 20 micrometers.

As an embodiment, the output power of the optical parametric oscillator is 0.5 W or more.

As an embodiment, the area of the nonlinear optical crystal is in a range from 0.5 to 5 $cm^2$.

As an embodiment, the area of the nonlinear optical crystal is in a range from 5 to 10 $cm^2$.

As an embodiment, manners for achieving phase matching in the nonlinear optical crystal is by the pump laser source comprise collinear, non-collinear, critical and non-critical phase matching.

As an embodiment, the pump laser source includes a liquid laser, a solid laser, a gas laser or a semiconductor laser.

As an embodiment, the pump laser source includes a continuous wave laser or a pulse laser.

According to another aspect of the present application, a second harmonic generator is disclosed, which contains one or more nonlinear optical crystal and a pump laser source; wherein the nonlinear optical crystal is at least one selected from said nonlinear optical crystal material and/or said nonlinear optical crystal material prepared by any said method.

As an embodiment, the wavelength of the laser emitted by the pump laser source is in a range of from 1 to 20 micrometers.

As an embodiment, manners for achieving phase matching in the nonlinear optical crystal by the pump laser source comprise collinear, non-collinear, critical and non-critical phase matching.

As an embodiment, the pump laser source includes a liquid laser, a solid laser, a gas laser or a semiconductor laser.

As an embodiment, the pump laser source includes a continuous wave laser, or a pulse laser.

As an embodiment, the output power of the second harmonic generator is 0.5 W or more.

As an embodiment, the area of the nonlinear optical crystal is in a range from 1.0 to 5 $cm^2$.

As an embodiment, the area of the nonlinear optical crystal is in a range from 5 to 10 $cm^2$.

The advantages of the present application include but not limit to:
(1) The present application provides a new nonlinear optical crystal material with an excellent infrared nonlinear optical performance. Its frequency-doubling intensity can reach 9.3 times of $AgGaS_2$, and it meets type-I phase matching; and its laser damage threshold can reach 7.5 times of $AgGaS_2$.
(2) The present application provides a method for preparing the nonlinear optical crystal material using high temperature solid state method with the presence of a fluxing agent. Due to simple steps, high yields, high purity and high crystallinity of the crystal material product, the method is suitable for large scale industrial production.
(3) The nonlinear optical crystal material provided in the present application is a polar crystal with an outstanding infrared nonlinear optical performance, which is expected to have an important application value in the frequency-converters which can be used for frequency doubling, sum frequency, difference frequency, optical parametric oscillation of laser in mid and far infrared waveband, and the like.

DETAILED DESCRIPTION OF THE EMBODIMENTS

The present application will be further described by combining with Examples. It should be understand that these Examples are only used to illustrate the present application and not to limit the scope of the present application.

Example 1

Preparation of Powder Crystal Sample

A mixture was obtained by homogeneously mixing a fluxing agent with raw materials comprising of $Ga_2O_3$, elementary substance of boron and elementary substance of selenium with the molar ratio of $Ga_2O_3$:B:Se=1:2:3. After being grinded homogeneously, the mixture was put into a quartz reactor tube; and then the quartz reactor tube was sealed by oxyhydrogen flame after being vacuumized to $10^{-2}$ Pa. And then the quartz reactor tube was put into a high temperature furnace to be heated to solid melting temperature, and then kept at the solid melting temperature for some time. And then after the temperature was reduced to 300° C. at a cooling rate of no more than 5° C./hour, stop heating and naturally cool to room temperature. After being washed by distilled water to remove the fluxing agents and being dried, the powder samples of nonlinear optical crystal material were obtained.

The sample numbers, the components of raw materials, the component and amount of the fluxing agents, solid melting temperatures and holding time at solid melting temperature are shown in Table 1.

TABLE 1

| Samples | Components of raw material $R_2O_3$ | elementary substance Q | Fluxing agent, mass ratio of fluxing agent to the raw material | Solid melting temperature (°C.) | Holding time at solid melting temperature (h) |
|---|---|---|---|---|---|
| 1# | $Ga_2O_3$ | Se | KI 3:1 | 850 | 72 |
| 2# | $Ga_2O_3$ | Se | KI 5:1 | 950 | 24 |
| 3# | $Ga_2O_3$ | Se | KBr 3:1 | 900 | 48 |

Example 2

Preparation of Single Crystal Sample

The components of raw materials and the mass ratio of fluxing agent to the raw material are same as Sample 1# at Example 1. The mixture of the raw material and the fluxing agent was grinded to be homogeneous and put into a quartz reactor tube; and then the quartz reactor tube was sealed by oxyhydrogen flame after being vacuumized to $10^{-2}$ Pa. And then the quartz reactor tube was put into a high temperature furnace to be heated to 650° C.; after being kept at 650° C. for 5 hours, the temperature was heated to 950° C. for 24 hours. And then after the temperature was reduced to 300° C. at a cooling rate of no more than 5° C./hour, stop heating and naturally cool to room temperature. After being washed by distilled water to remove the fluxing agent KI and being dried, the single crystal sample of nonlinear optical crystal material was obtained and denoted as Sample 4#.

Example 3

Structural Characterization of the Samples

The X-ray powder diffraction (XRD) patterns of Samples 1# to 4# were measured using Rigaku MiniFlex II X-ray Diffractometer with Cu target, Kα radiation source (λ=0.154184 nm). The results indicated that Samples 1# to 4# all were with high purity and high crystallinity. The typical one was the XRD pattern of Sample 4#, which was shown in FIG. 1. XRD patterns of Sample 1#, Sample 2#, Sample 3# were similar to that shown in FIG. 1, which showed that each corresponding peak had the same peak position and the ±5% difference of peak intensity, indicating that the structures of all the samples were same.

Figure 1:
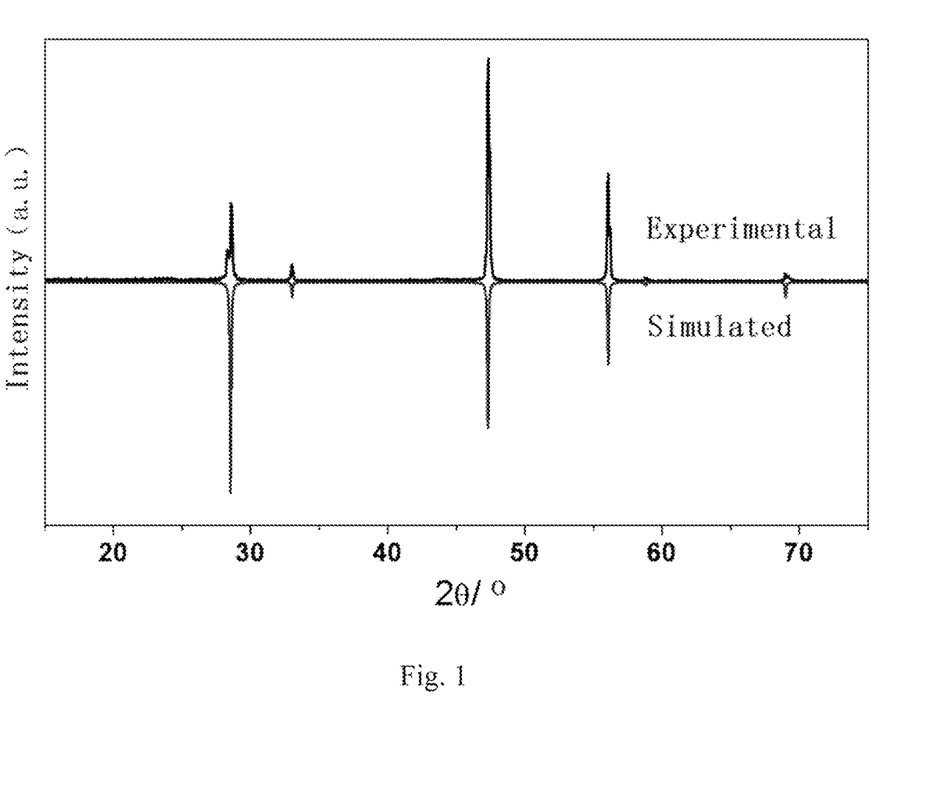
FIG. 1 is X-ray powder diffraction (XRD) patterns of Sample 4[#], comparing the experimental pattern with the theoretical pattern simulated from the structure of single crystal.

The single crystal X-ray diffraction analysis of Sample 4# was performed using Rigaku Mercury CCD X-ray Diffractometer with Mo target, Kα radiation source (λ=0.07107 nm), operated at 293K. The crystal structure was resolved by Shelxtl97. FIG. 1 is XRD pattern of Sample 4#, comparing the experimental pattern with the theoretical pattern simulated from the structure of single crystal. It showed that the experimental pattern was highly consistent with the theoretical pattern, indicating that the sample prepared was with high purity and high crystallinity.

Figure 2:
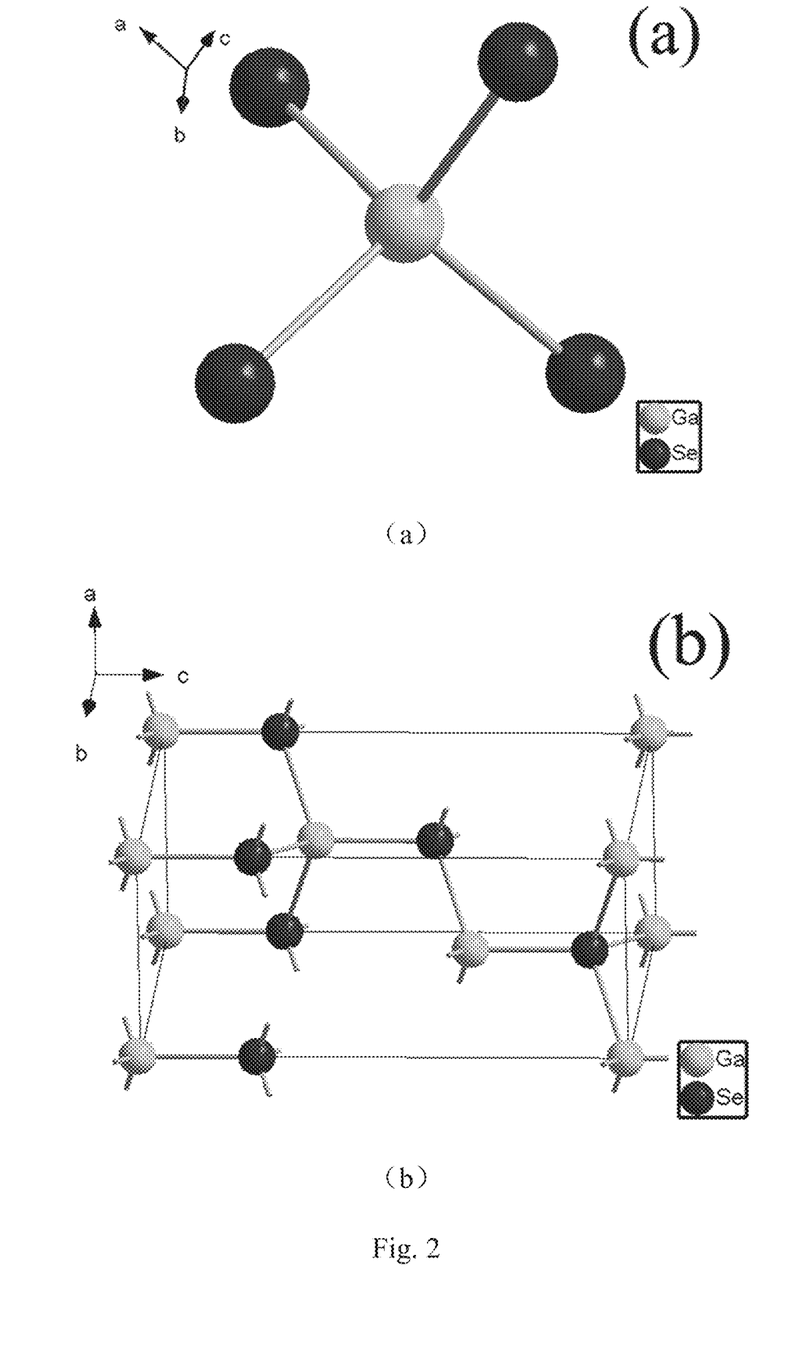
FIG. 2 is the crystal structure schematic of Sample 4[#]; wherein (a) is asymmetric unit and (b) is the structure of unit cell.

Crystallographic Data of Sample 4# was shown in Table 2. The structures of asymmetric unit and the unit cell were shown at FIG. 2 (a) and FIG. 2 (b), respectively. In the crystal, the valences of gallium and selenium are +3 and −2, respectively. A gallium atom connects with the nearest four selenium atoms to form a $GaSe_4$ tetrahedron, and $GaSe_4$ tetrahedral share corners to form three-dimensional network structure.

TABLE 2

| Crystallographic Data | |
|---|---|
| molecular formula | $Ga_2Se_3$ |
| molecular weight | 376.32 |
| crystal size (mm³) | 0.16 × 0.14 × 0.08 |
| Temperature (K) | 293(2) |
| Wavelength (Mo, Kα, Å) | 0.71073 |
| Space Groups | trigonal system, space group R3 |
| a (Å) | 3.858(3) |
| b (Å) | 3.858(3) |
| c (Å) | 9.443(11) |
| α = β | 90° |
| γ | 120° |
| Z | 1 |
| V (Å³) | 121.72(19) |
| density $D_c$ (g·cm⁻³) | 5.134 |
| absorption coefficient μ (mm⁻¹) | 33.298 |
| F(000) | 164 |
| θ range (°) | 6.48-26.85 |
| R1$^a$ (I > 2σ(I)) | 0.0367 |
| wR2$^b$ (all data) | 0.0538 |
| GOF on F² | 0.837 |
| $\Delta\rho_{max}/\Delta\rho_{min}$, e/Å³ | 0.721/−0.721 |

$^a$R1 = ||$F_o$| − |$F_c$||/|$F_o$|
$^b$wR2 = [w($F_o^2$ − $F_c^2$)²]/[w($F_o^2$)²]$^{1/2}$.

Example 4

Optical Properties Measurement of the Samples 1# to 4#

The second order nonlinear effects of Samples 1# to 4# were measured on Kurtz-Perry System. The UV-Vis-NIR diffuse reflectance spectra were measured on Perkin-Elmer Lambda 950 Ultraviolet—visible—near infrared spectrometer. The infrared transmission spectra of Samples 1# to 4# were measured on Bruker Vertex 70 infrared spectrometer.

The results indicated that Samples 1# to 4# had the similar optical properties.

The frequency-doubling intensities of Samples 1# to 4# all were over 9.3 times of $AgGaS_2$ with the same particle size, ranging from 200 μm to 300 μm. The laser damage thresholds of Samples 1# to 4# all were over 7.5 times of commercial material $AgGaS_2$ with the same particle size, ranging from 75 μm to 150 μm.

As typical sample, the laser-damaged threshold comparison of Sample 1# with $AgGaS_2$ was shown in Table 3.

Figure 3:
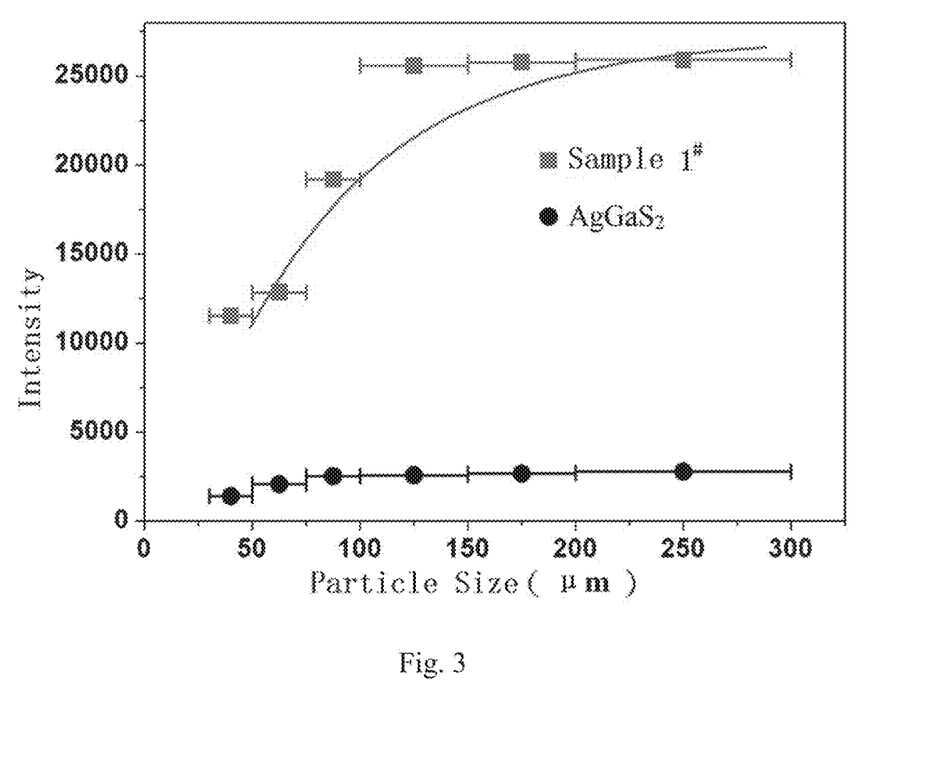
FIG. 3 is the curve of frequency-doubling intensity as a function of particle size for Sample 1[#].

As a representative sample, the curve of frequency-doubling intensity as a function of particle size for Sample 1# was shown in FIG. 3, which indicated that the frequency-doubling intensity increased with the increase of particle size, showing typical type-I phase matching.

Figure 4:
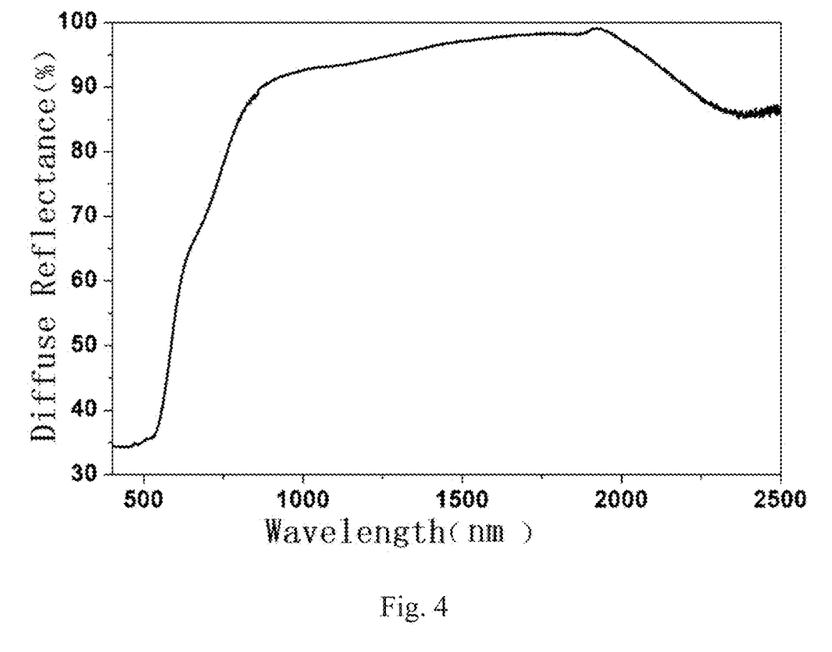
FIG. 4 is the UV-Vis-NIR diffuse reflectance spectrum of Sample 1[#].
Figure 5:
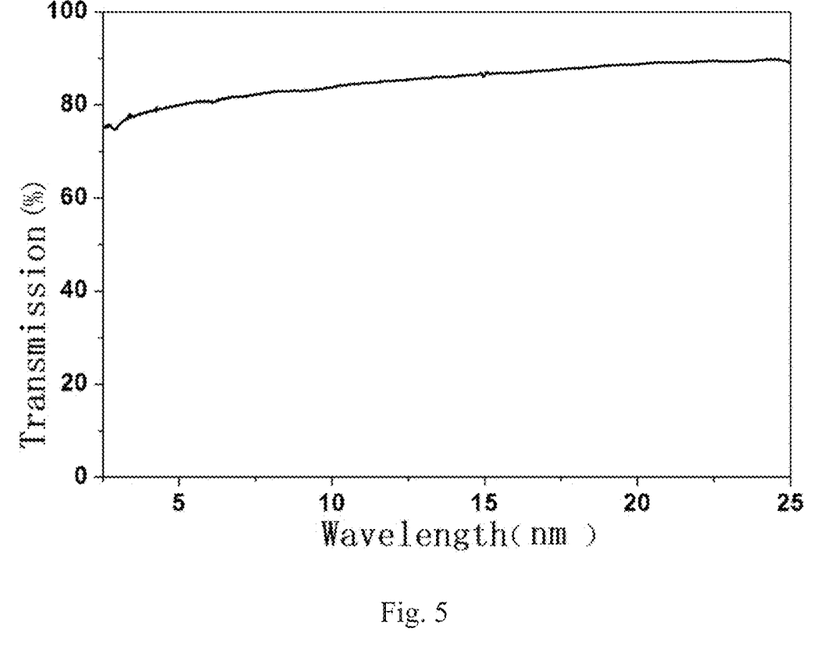
FIG. 5 is the infrared transmission spectrum of Sample 1[#].

As a representative sample, the light transmittance property of Sample 1# were shown in FIG. 4 and FIG. 5, indicating the transmission region from 0.65 μm to 25 μm and the band gap of 1.90 eV.

TABLE 3

| Compound | Space Group | band gap (eV) | Laser-damaged threshold (MW/cm²) |
|---|---|---|---|
| Sample 1# with particle size range from 75 μm to 150 μm | R3 | 1.90 | 4.19 |
| AGS with particle size range from 75 μm to 150 μm | I-42d | 2.52 | 0.558 |

Example 5

The Sample 4# was subjected to directionally cutting and polishing treatment, to make an optical parametric device. A Q-switched Nd:YAG laser light source having wavelength of 1.064 μm was used as the pump light source, to produce a laser output of 3~14 micrometers.

Example 6

The Sample 4# was subjected to directionally cutting and polishing treatment, to make an optical parametric device. A Q-switched Nd:YVO laser light source having wavelength of 1.34 μm was used as the pump source, to produce a laser output of 3~14 micrometers.

Example 7

The Sample 4# was subjected to directionally cutting and polishing treatment, to make an optical parametric device. A Q-switched Ho:YAG laser light source having wavelength of 2.06 μm was used as the pump source, to produce a laser output of 3~14 micrometers.

Example 8

The Performance Test of the Second Harmonic Generator

A second harmonic generator was produced using the Sample 4# as the nonlinear optical frequency conversion crystal, and a pump laser source. It was observed via output profile test that, this second harmonic generator may still produce good output profile at high output.

Example 9

The Performance Test of the Optical Parametric Oscillator

An optical parametric oscillator was produced using the Sample 4# as a nonlinear optical frequency conversion crystal, a first lens, a laser crystal, and a second lens. It was observed via output profile test that, this optical parametric oscillator may still produce good output profile at high output.

The foregoing is only several examples and preferred embodiments of the present application, and is not any kind of limit to the scope of the present application. However, it can be conceived that other variations and modifications can be made without departing from the scope covered by the claims of the present application, and all of these variations and modifications fall into the scope of protection of the present application.

The invention claimed is:

1. A nonlinear optical crystal material, whose molecular formula is $$Ga_2Se_3$$

wherein the crystal structure of said nonlinear optical crystal material belongs to a trigonal system, and space group R3 with the lattice parameters of a=b=3~4.2 Å, c=9~10 Å, α=β=90°, γ=120° and Z=1.

2. A method for preparing the nonlinear optical crystal material according to claim 1, wherein after homogeneously mixing raw materials containing gallium and selenium with a fluxing agent, said nonlinear optical crystal material is obtained by a high temperature solid state method.

3. The method for preparing the nonlinear optical crystal material according to claim 2, wherein said fluxing agent is at least one selected from alkali metal halides and alkali earth metal halides.

4. An infrared detector, which contains said nonlinear optical crystal material according to claim 1.

5. An infrared laser, which contains said nonlinear optical crystal material according to claim 1.

6. An optical parametric oscillator, wherein the optical parametric oscillator contains, in the light path, a pump laser source, a first lens, a nonlinear optical crystal, and a second lens in this order;
wherein an optical parametric oscillation chamber is formed between the first lens and the second lens;
wherein the nonlinear optical crystal is at least one selected from said nonlinear optical crystal material according to claim 1.

7. The optical parametric oscillator according to claim 6, wherein the wavelength of the laser emitted by the pump laser source is in a range from 1 to 20 micrometers.

8. The optical parametric oscillator according to claim 6, wherein the area of the nonlinear optical crystal is in a range from 0.5 to 5 cm².

9. The optical parametric oscillator according to claim 6, wherein the area of the nonlinear optical crystal is in a range from 5 to 10 cm².

10. The optical parametric oscillator according to claim 6, wherein the output power of the optical parametric oscillator is 0.5 W or more.

11. The optical parametric oscillator according to claim 6, wherein manners for achieving phase matching in the nonlinear optical crystal by the pump laser source comprise collinear, non-collinear, critical and non-critical phase matching.

12. The optical parametric oscillator according to claim 6, wherein the pump laser source includes a liquid laser, a solid laser, a gas laser or a semiconductor laser.

13. The optical parametric oscillator according to claim 6, wherein the pump laser source includes a continuous wave laser, or a pulse laser.

14. A second harmonic generator, wherein the second harmonic generator containing one or more nonlinear optical crystal and a pump laser source;
wherein the nonlinear optical crystal is at least one selected from said nonlinear optical crystal material according to claim 1.

15. The second harmonic generator according to claim 14, wherein the wavelength of the laser emitted by the pump laser source is in a range of from 1 to 20 micrometers.

16. The second harmonic generator according from claim 14, wherein the output power of the second harmonic generator is 0.5 W or more.

17. The second harmonic generator according to claim 14, wherein the area of the nonlinear optical crystal is in a range of from 1.0 to 5 cm².

18. The second harmonic generator according to claim 14, wherein the area of the nonlinear optical crystal is in a range from 5 to 10 cm².

19. The second harmonic generator according to claim 14, wherein manners for achieving phase matching in the nonlinear optical crystal by the pump laser source comprise collinear, non-collinear, critical and non-critical phase matching.

20. The second harmonic generator according to claim 14, wherein the pump laser source includes a liquid laser, a solid laser, a gas laser or a semiconductor laser.

21. The second harmonic generator according to claim 14, wherein the pump laser source includes a continuous wave laser or a pulse laser.

* * * * *